United States Patent [19]

Isakozawa et al.

[11] Patent Number: 5,008,536

[45] Date of Patent: Apr. 16, 1991

[54] ELECTRON MICROSCOPE HAVING ELECTRICAL AND MECHANICAL POSITION CONTROLS FOR SPECIMEN AND POSITIONING METHOD

[75] Inventors: Shigeto Isakozawa; Takahito Hashimoto, both of Katsuta, Japan

[73] Assignee: Hitachi, Ltd., Tokyo, Japan

[21] Appl. No.: 446,283

[22] Filed: Dec. 5, 1989

[30] Foreign Application Priority Data

Dec. 5, 1988 [JP] Japan ................. 63-307278

[51] Int. Cl.$^5$ ............................... H01J 37/26
[52] U.S. Cl. ................. 250/307; 250/311
[58] Field of Search ............. 250/306, 311, 307, 397

[56] References Cited

U.S. PATENT DOCUMENTS

| | | | |
|---|---|---|---|
| 3,737,659 | 6/1973 | Yanaka et al. | 250/311 |
| 3,757,117 | 9/1973 | Müller et al. | 250/311 |
| 4,044,255 | 8/1977 | Kirsch et al. | 250/311 |
| 4,687,931 | 8/1987 | Fukuhara et al. | 250/310 |

*Primary Examiner*—Bruce C. Anderson
*Attorney, Agent, or Firm*—Antonelli, Terry, Stout & Kraus

[57] ABSTRACT

An electron microscope and positioning method comprises a stage, an objective lens, a magnifying lens, a magnification setting the magnifying lens, a stage mover for mechanically moving the stage in two directions defining a two dimensional space so as to move a visual field of the speciment and a electrical shifting device which is disposed on opposite sides of an axis of rotation about which the image is rotated through an angle in the two dimensional directions so as to move the visual field in fine increments. The objective lens rotates the electron beam through the angle. A control panel sets the moving distance and moving direction of the stage mover and the electrical shifting device, and a computer selects the stage mover or the electrical shifting device according to the magnification setting and controls the stage mover or the electrical shifting device according to the moving distance and the moving direction. The stage mover and the electrical shifting device are automatically and selectively controlled by the control panel according to the magnification setting without changing the moving direction of the specimen image displayed in an image observing device.

11 Claims, 1 Drawing Sheet

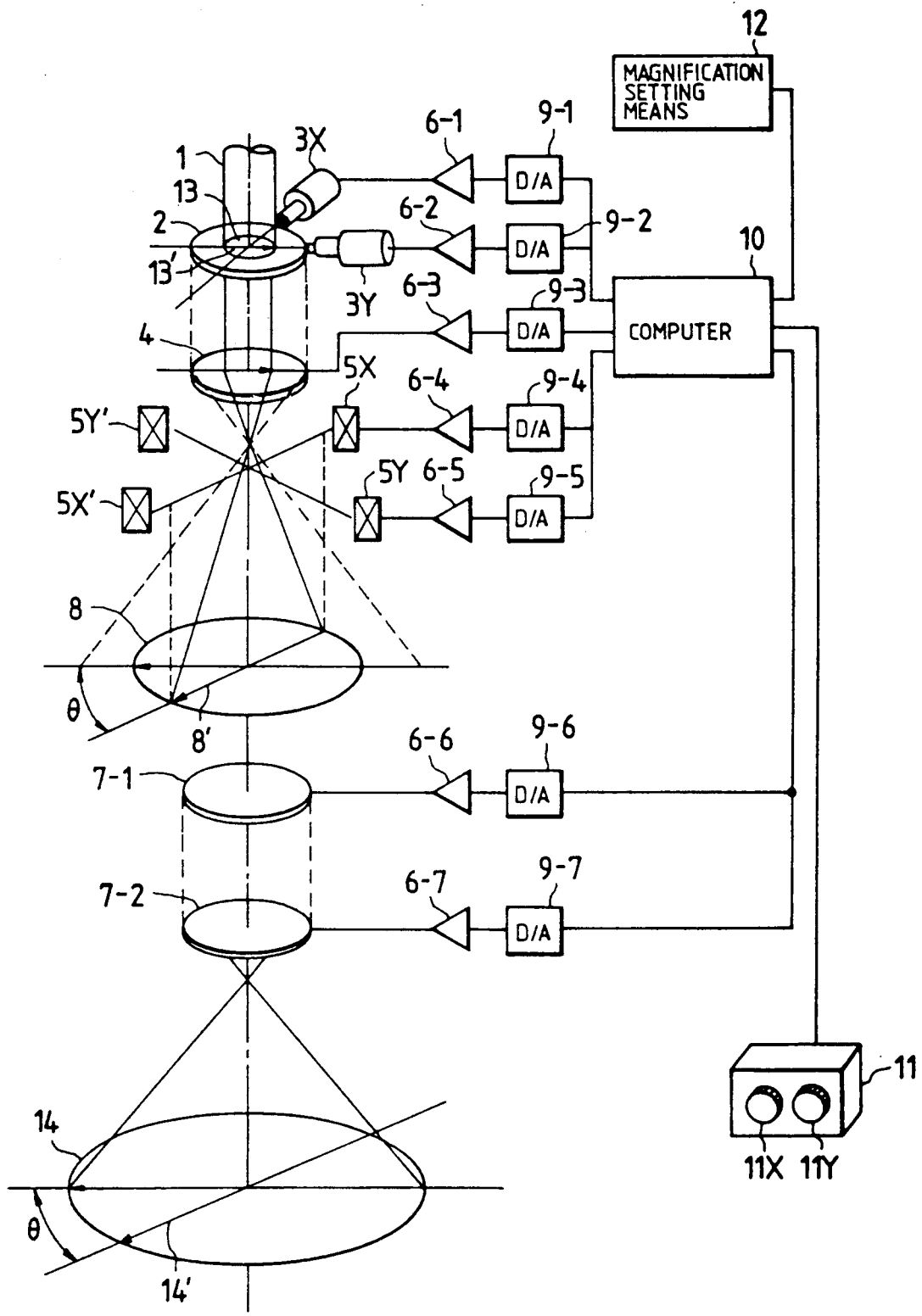

ELECTRON MICROSCOPE HAVING ELECTRICAL AND MECHANICAL POSITION CONTROLS FOR SPECIMEN AND POSITIONING METHOD

BACKGROUND OF THE INVENTION

The present invention relates to an electron microscope and positioning method and more particularly to an electron microscope having an improved mechanical stage mover for moving a visual field of the specimen and an electrical shifter for deflecting an electron beam transmitted from a specimen on the stage. The mover and shifter are selectively controlled from a control panel so as to move in minute or fine increments the visual field of the specimen keep the constant direction of the image in accordance with the method of the present invention.

In a conventional electron microscope, the mechanical stage mover and the electrical shifter for deflecting the electron beam transmitted from the specimen are selectively exchanged by manually controlling a common control knob according to a magnification without changing the constant moving direction of an image.

The mechanical stage mover has motors which respectively and linearly move the stage to intersecting X and Y directions and the maximum moving range of the mechanical stage moving means is usually ±1 mm and the minimum moving range is about 100 Å which is determined by the accuracy of the motor or gear used in the mechanical stage mover.

The conventional electrical shifter is installed under an objective lens and deflects the electron beam transmitted from the specimen on the stage so as to shift in minute or fine increments the visual field of the specimen. The maximum moving range of the electrical shifter is usually ±1 μm in order to avoid undesired aberration influences in the electro-optical system. It is also possible to make the minimum moving range smaller than about 1 Å by improving the stability of the current flowing in the deflecting coil.

When observing the specimen with a low magnification, the conventional mechanical stage mover is used, and when observing with a high magnification, the electrical shifter is used. In a middle magnification situation between the low magnification however, and the high magnification, the operator must frequently select the mechanical mover or the electrical shifter. The U.S. Pat. No. 4,494,000, and Japanese Patent Laid-open documents 55-90042 and 59-16256 are cited as examples of such a device.

Further, U.S. Pat. No. 4,520,264 disclose an image forming lens system which can rotate the final image without the necessity of an additional lens or lenses.

Nevertheless, the moving direction of the image of the specimen in the conventional electron microscope changes more than just a little when the magnification of the electron microscope is changed. Because the magnetic fields of the objective lens, the electrical shifter and a magnification lens under the electrical shifter affect the rotation of the electron beam, it is difficult to correct not to rotate the image of the specimen.

SUMMARY OF THE INVENTION

The present invention overcomes the above mentioned problem of the conventional electron microscopes.

An object of present invention is to provide a electron microscope and positioning method utilizing a mechanical stage mover and an electrical shifter for deflecting an electron beam from a specimen on the stage, in which the mover and shifter are selectively controlled from a common control panel without significant change of the moving direction of the specimen image.

The foregoing object has been attained by providing a magnification lens below the electrical shifter which does not rotate the electron beam when changes in selected magnification of the electron microscope occur, and further by installing the electrical shifter at a position where the electron beam is rotated from the direction of the mechanical stage mover by the objective lens.

BRIEF DESCRIPTION OF THE DRAWING

The sale figure is a schematic view of an embodiment of the electron beam microscope with improved mechanical stage mover and electrical shifter in accordance with the present invention

DETAILED DESCRIPTION OF THE PRESENTLY PREFERRED EMBODIMENTS

In the FIGURE, an electron beam 1 is directed onto a specimen 13 placed across a central hole of a stage 2. The stage 2 is moved in the X direction by a linear motor 3X and is moved in the Y direction, which intersects the X direction, by a linear motor 3Y. The electron beam 1 transmitted through the specimen 13 passes through the objective lens 4 to a plane 8. The electron beam 1 is rotated by a magnetic field of the objective lens 4, and the direction of the specimen 13 on the stage 2 shown as an arrow 13' is rotated by an angle $\theta$ so as to form the image of the specimen having a direction of the image on the plane 8 shown as an arrow 8'. Image shift coils 5X, 5X' and 5Y, 5Y' are respectively disposed in directions which are rotated by the angle $\theta$ from the X direction and the Y direction, which X and Y directions are respectively moving directions of the stage 2 by means of the linear motors 3X and 3Y.

The image of the specimen projected onto the plane 8 is enlarged by magnification lenses 7-1, 7-2 and has a direction shown as an arrow 14' on a fluorescent screen 14. The image on the fluorescent screen 14 is detected and displayed on a known image observing device which is not shown in FIG. 1 for clarity. The magnification lenses 7-1, 7-2 are constructed in a conventional manner so as not to rotate the electron beam as shown, for example, in U.S. Pat. No. 4,494,000.

Numerals 6-1, 6-2, 6-3, 6-4, 6-5, 6-6 and 6-7 denote power supplies and numerals 9-1, 9-2, 9-3, 9-4, 9-5, 9-6 and 9-7 denote digital / analog converters (D/A), numeral 10 denotes a computer, numeral 11 denotes a common control panel with control knobs 11X, 11Y, and numeral 12 denotes a magnification setting device.

The linear motors 3X, 3Y are connected to the respective power supplies 6-1, 6-2, and the moving distances for the linear motors 3X, 3Y are supplied thereto as analog signals from the digital / analog converters 9-1, 9-2 based on a digital signal from the computer 10. The objective lens 4 is connected to the power supply 6-3 and the current for the objective lens 4 is supplied thereto as analog signals from the digital / analog converter 9-3 based on a digital command signal from the computer 10. The image shift coils 5X, 5X' and 5Y, 5Y' are respectively connected to the power supplies 6-4, 6-5, and the shifting distances for the image on the plane 8 are supplied as analog signals from the digital / analog converters 9-4, 9-5 based on a digital command signal from the computer 10. The magnification lenses 7-1, 7-2 are respectively connected to the power supplies 6-6, 6-7, and the currents for the magnification lenses 7-1, 7-2 are supplied as analog signals from the digital / analog converters 9-6, 9-7 based on a digital signal from the computer 10 so as to prevent ratation of the image on the plane 8 and to form a magnified image on the fluorescent screen 14. Thus, the direction of the image in plane 8 shown by arrow 8' is the same as that of the image on the screen 14 shown by arrow 14'.

In the electron microscope having the above construction, the magnification of the electron microscope 20 is at first set by the magnification setting device 12. At this time, an operator actuates the control panel 11 via the knobs 11X and 11Y. The knob 11X is actuated for stage movement in the X direction according to the degree of rotation of the knob 11X, and the knob 11Y is actuation for stage movement in the Y direction according to the degree of rotation of the knob 11Y. The computer 10 either inputs the magnification set by the magnification setting device 12 and selects appropriate moving distance for the linear motors 3X, 3Y or compares the magnification set by the magnification setting device 12 with a predetermined value, for example a predetermined magnification value x$10^5$, set in the computer 10. When the magnification set by the magnification setting device 12 is larger than the predetermined magnification value x$10^5$, the computer 10 selects the image shift coils 5X, 5X' and 5Y, 5Y' and generates appropriate digital outputs corresponding to the moving distances appropriate in the X and Y directions to the digital / analog converters 9-4, 9-5 which generate analog signals respresentative of the moving distances in the X and Y directions to the power supplies 6-4, 6-5 so as to excite the image shift coils 5X, 5X' and 5Y, 5Y' and shift the image 8' of the specimen on the plane 8.

When the magnification set by the magnification setting device 12 is not larger than the predetermined value x$10^5$, the computer 10 selects the linear motors 3X, 3Y and generates digital corresponding to the appropriate moving distances in the X and Y directions to the digital / analog converters 9-1, 9-2 which generate analog signals representative of the moving distances in the X and Y directions to the respective power supplies 6-1, 6-2 so as to control the linear motors 3X, 3Y and move the specimen 13 on the stage 2 to the desired position.

The computer 10 always searches the magnification set on the magnification setting device 12 in order automatically and immediately to select either the linear motors 3X, 3Y or the image shift coils 5X, 5X' and 5Y, 5Y' as the magnification is changed.

In another embodiment of the present invention, an operator actuated switch can be provided for manually changing between the linear motors 3X, 3Y and the image shift coils 5X, 5X' and 5Y, 5Y'.

As apparent from the embodiments stated above, the present invention attains following advantages.

(1) The best image moving mode according to the changing magnification can be easily selected without hesitation hesitating to judge which image moving means should be.

(2) The mechanical stage mover and the electrical for deflecting the electron beam are automatically selected from a common control panel with little change of moving direction of the specimen image which is displayed on the image observing screen.

We claim:

1. An electron microscope, comprising:
   a stage for mounting a specimen;
   an objective lens for magnifying an electron beam transmitted from the specimen;
   a magnifying lens for magnifying the electron beam passed through the objective lens;
   means for setting a magnification of the electron microscope;
   means for controlling an electric current of the magnifying lens according to the magnification setting;
   means for observing an image of the specimen by detecting the electron beam passed through the magnifying lens;
   means for mechanically moving the stage a predetermined amount in two directions so as to move a visual field of the specimen;
   means for deflecting the electron beam passing through the objective lens, said means for deflecting having deflecting coils which are rotated by a predetermined angle with respect to the two directions, wherein the electron beam is rotated by said predetermined angle by the objective lens;
   means for actuating the mechanical moving means and the deflecting means, said means for actuating producing output signals for actuating at least one of the mechanical moving means and the deflecting means; and
   means for selecting the mechanical moving means or the deflecting means according to the magnification setting and controlling the selected one of the mechanical moving means and the deflecting means according to at least the output signals from the actuating means.

2. An electron microscope as defined in claim 1, wherein the selecting means is manually controlled by an operator.

3. An electron microscope as defined in claim 1, wherein the mechanical moving means consists of linear motors which respectively move the stage in the two directions.

4. An electron microscope as defined in claim 1, wherein the deflecting means comprises deflecting coils disposed in directions which are respectively rotated said predetermined angle from said two directions.

5. An electron microscope as defined in claim 4, wherein the deflecting coils are arranged in pairs disposed oppositely around an axis of rotation.

6. An electron microscope as defined in claim 1, wherein the deflecting coils deflect the electron beam towards the rotated directions.

7. An electron microscope as defined in claim 1, wherein the actuating means comprises a control panel.

8. An electron microscope as defined in claim 1, wherein the selecting means is a computer.

9. A specimen and image position controlling method, for use in an electron microscope, comprising the steps of:
   setting a magnification of the electron microscope;
   setting a moving distance and a moving direction of a stage on which said specimen is placed;

comparing the setting of magnification with a predetermined magnification value;

shifting only an image of said specimen when the setting of magnification is larger than the predetermined value; and shifting only the specimen in a certain direction and for a certain distance when the setting of magnification is not larger than the predetermined value.

10. The method according to claim 9, wherein a change from the shifting of one of the image and the specimen to the shifting of the other of the image and the specimen is effected automatically.

11. The method according to claim 9, wherein change from the shifting of one of the image and the specimen to the shifting of the other of the image and the specimen is effected manually.

* * * * *